United States Patent [19]
Chishiki

[11] Patent Number: 5,517,456
[45] Date of Patent: May 14, 1996

[54] SEMICONDUCTOR MEMORY DEVICE INCLUDING A WORD LINE DRIVING CIRCUIT OF THE DIVISIONAL DECODING TYPE

[75] Inventor: Shigeo Chishiki, Tokyo, Japan

[73] Assignee: NEC Corporation, France

[21] Appl. No.: 330,796

[22] Filed: Oct. 28, 1994

[30] Foreign Application Priority Data

Nov. 2, 1993 [JP] Japan ................................. 5-274140

[51] Int. Cl.⁶ .................................................. G11C 8/00
[52] U.S. Cl. ................... 365/230.03; 365/230.04; 365/230.06
[58] Field of Search ................. 365/230.03, 230.04, 365/230.06, 230.01, 230.08

[56] References Cited

U.S. PATENT DOCUMENTS 5,327,389  7/1994  Seok et al. .................. 365/230.03

FOREIGN PATENT DOCUMENTS 047825   4/1992  European Pat. Off. .
4117881  12/1991  Germany .
4243903  7/1993   Germany .

*Primary Examiner*—David C. Nelms
*Assistant Examiner*—Huan Hoang
*Attorney, Agent, or Firm*—Hayes, Soloway, Hennessey, Grossman & Hage

[57] ABSTRACT

A memory cell array is divided into a plurality of blocks selected by an upper row address and further divided into a plurality of sub blocks in a word line direction. Word line driving circuits are provided individually for each of the sub blocks. Further, a plurality of word line driving current supplying circuits are provided which are selectively activated in response to an input of all or part of an upper row address for selection of one of the plurality of blocks to supply word line driving current to the word line driving circuits. The word line driving circuits in the same column direction are supplied with word line driving current by way of at least two signal lines.

4 Claims, 4 Drawing Sheets

ས5,517,456

SEMICONDUCTOR MEMORY DEVICE INCLUDING A WORD LINE DRIVING CIRCUIT OF THE DIVISIONAL DECODING TYPE

BACKGROUND OF THE INVENTION

1. Field of the Invention

This invention relates to a semiconductor memory device, and more particularly to a semiconductor memory device which includes a word line driving circuit of the divisional decoding type.

2. Description of the Prior Art

The degree of integration of semiconductor memory devices increases with advances in the technology in fine working technique. In particular, high integration has been achieved with dynamic random access memories (hereinafter referred to as DRAMs) which have a simple memory structure, and at present, DRAMs of 16 Mbits are being mass-produced and sample shipment of DRAMs of 64 Mbits is also planned.

64-Mbit DRAMs are semiconductor memory devices of the divisional decoding type wherein word lines are divided into a plurality of blocks and a word line driving circuit for supplying current is provided for each block of word lines to achieve high speed driving of the word lines.

FIG. 1 is a circuit diagram showing the basic construction of a semiconductor memory device of the divisional decoding type, and FIG. 2 is a circuit diagram of a word line driving circuit represented by WD1a in FIG. 1.

A memory cell array is divided into a plurality of blocks each selected by an upper row address, and each block is divided into a plurality of sub blocks SB1a to SB1c, SB2a to SB2c and SB3a to SB3a in the word line direction.

Word line driving circuits WD1a to WD1d are disposed in a manner such that sub block SB1a, SB1b, SB1c line between word line driving circuit W1a and WD1b, WD1b and WD1c, WD1c, and WD1d, resectively. Word line driving circuits WD2a to WD2a, WD3a to WD3d and WD4a to WD4d are disposed with respect to sub block SB2a to SB2c, SB3a to SB3a and SB4a to SB4a in the same way as word line driving circuits WD1a to WD1d. Word lines in sub block SB1a are alternately connected with word line driving circuit WD1a and WD1b. Similarly, word lines in sublock SB1b, SB1c, ..., SB4a are alternately connected with word line driving circuit WD1b and WD1c, WD1c, and WD1d, . . , WD4c and WD4d, respectively.

Further, sensing amplifiers SA1a to SA1c, SA2a to SA2c, SA3a to SA3c and SA4a to SA4c for amplifying data of bit lines are provided for sub blocks SB1a to SB1c, SB2a to SB2c, SB3a to SB3a and SB4a to SB4a, respectively. Sensing amplifiers SA1a to SA1c, SA2a to SA2c, SA3a to SA3c and SA4a to SA4c are determined by upper row address signals S1 and S2 and are selectively activated by block select signals BLS1 to BLS4 outputted from block select signal generation circuit BSG1.

Memory cells MC0 and MC1 are disposed at points at which word lines WL0a and WL1a intersect with bit lines BL00 and BL10, respectively.

In order to select word line driving circuits WD1a to WD1d, complementary signals XSW and XSWB are outputted from row decoder RD1 to word line driving circuits WD1a to WD1d. Meanwhile, word line driving current supplying signals RA01 and RA11 supplied from word line driving current supplying circuit RAG run vertically with respect to word lines WL0a and WL1a on word lines WD1a to WD4d, and word line driving current supplying signal RA01 is inputted to word line driving circuits WD1a, WD2a, WD3a, WD4a, WD1c, WD2c, WD3c, WD4c while word line driving current supplying signal RA11 is inputted to word line driving circuits WD1b, WD2b, WD3b, WD4b, WD1d, WD2a, WD3d and WD4d. Row decoders RD2, RD3 and RD4 are provided corresponding to word line driving circuits WD2a to WD2a, WD3a to WD3d and WD4a to WD4d, respectively.

It is to be noted that, while, in the drawings, almost all of output signals of the row decoders, word lines, bit lines, memory cells and so forth are omitted for simplification of the drawings, each block has a similar construction.

Word line driving circuits WD1a to WD1d, WD2a to WD2a, WD3a to WD3d and WD4a to WD4d are each constituted from a driving circuit of the self-booting type as shown in FIG. 2.

If it is assumed that complementary signal XSW and word line driving current supplying signal RA01 are selected by a row address, then N-type transistor Q3 is put into an off-state by complementary signal XSWB. Consequently, the potential at node 1 rises from the ground potential to a potential equal to the difference between the power source voltage and the threshold level voltage of N-type transistor Q2. Then, when the potential of word line driving current supplying signal RA01 rises, the potential at node 1 rises due to self booting of the transistor to a potential higher than word line driving current supplying signal RA01, and the potential at word line WL0a rises to a potential equal to the potential of word line driving current supplying signal RA01. In this instance, not only in word line driving circuit WD1a but also in word line driving circuit WD1c, the potentials at word lines WL0b and WL0c rise so that memory cell on the word line as represented by MC0 is selected. Data of the selected memory cell is outputted to the bit line represented by BL00, and sensing amplifiers SA1a to SA1c are activated by block select signal BLS1 to amplify the data.

With the circuit construction described above, the wiring line distance per word line is decreased, and the rising rate of the word lines can be increased.

The above-described circuit construction, however, has the following disadvantages:

Generally, the word line rising time depends upon the wiring line resistance and the load capacitance of the word line and the wiring line resistance and the load capacitance of the word line driving current supplying circuit. In particular, if the wiring line resistance and the load capacities of the word line and the word line driving current supplying circuit are increased, then the word line rising time lengthens. On the other hand, the current consumed in driving the word line increases in proportion to the sum of the load capacitance of the word line and the word line driving current supplying signal. However, the wiring line resistance and the load capacitance of the word line depends upon such parameters as the material forming the word line and the number of memory cells connected to the word line, and in addition, the number of word lines to be activated at a time depends upon factors such as the limitation of the refresh cycle. Accordingly, it is difficult to reduce the wiring line resistance and the load capacitance of the word line. On the other hand, with regard to the word line driving current supplying signal, the load capacitance is the sum of the wiring line capacitance and the diffused layer junction capacitance of the word line driving circuit to which the word line driving current supplying signal is inputted. While the wiring line capacitance depends upon the width, the thickness, and the length of the wiring line, width and the thickness cannot be greatly decreased because so doing would increase the resistance value. On the other hand, the wiring line cannot be shortened because of restrictions in terms of layout. Accordingly, in order to reduce the load capacitance of the word line driving current supplying signal, the diffused layer capacitance of the word line driving circuit should be decreased, that is, the number of word line driving circuits to be connected to one word line driving current supplying signal should be decreased.

In the conventional word line driving system based on the divisional decoding system described above, however, since a word line driving current supplying signal is inputted in common to word line driving circuits in a block selected by an upper row address, when the number of blocks increases as the storage capacity increases, or when the number of word lines per one block increases, the load capacitance of the word line driving current supplying signal also increases, possibly resulting in a drop in speed when driving word lines or in an increase of current consumption.

SUMMARY OF THE INVENTION

It is an object of the present invention to provide a semiconductor memory device wherein a word line rises at a high speed and the current consumption is low even when the storage capacity is increased.

In accordance with the present invention, there is provided a semiconductor memory device comprising:

- a memory cell array including a plurality of memory cells disposed in rows and columns, said memory cell array being divided into a plurality of blocks selected by an upper row address, each block of said memory cell array being further divided into an equal number of sub blocks in a word line direction;
- a plurality of word lines for selecting a row of the plurality of memory cell arrays;
- a plurality of bit lines to which a column of said memory cell array is connected;
- sensing amplifiers corresponding to each of the sub blocks for amplifying data of the corresponding bit lines;
- word line driving circuit means corresponding to each of the sub blocks;
- row decoders for selecting the word line driving circuit means in each of the blocks; and
- a plurality of word line driving current supplying circuit means for being selectively activated in response to all or part of the upper row address for selection of one of said plurality of blocks to supply word line driving current to the word line driving circuit means;
- the word line driving circuit means in the same column direction being supplied with word line driving current by way of at least two signal lines.

Since word line driving current is supplied to the word line driving circuits in the same column direction by way of at least two signal lines, the number of word line driving circuits per word line driving current supplying signal is decreased. In other words, the load capacitance of the word line driving current supplying circuits are decreased. Consequently, the word line rising speed is increased, and the current consumption upon driving of the word lines is decreased.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
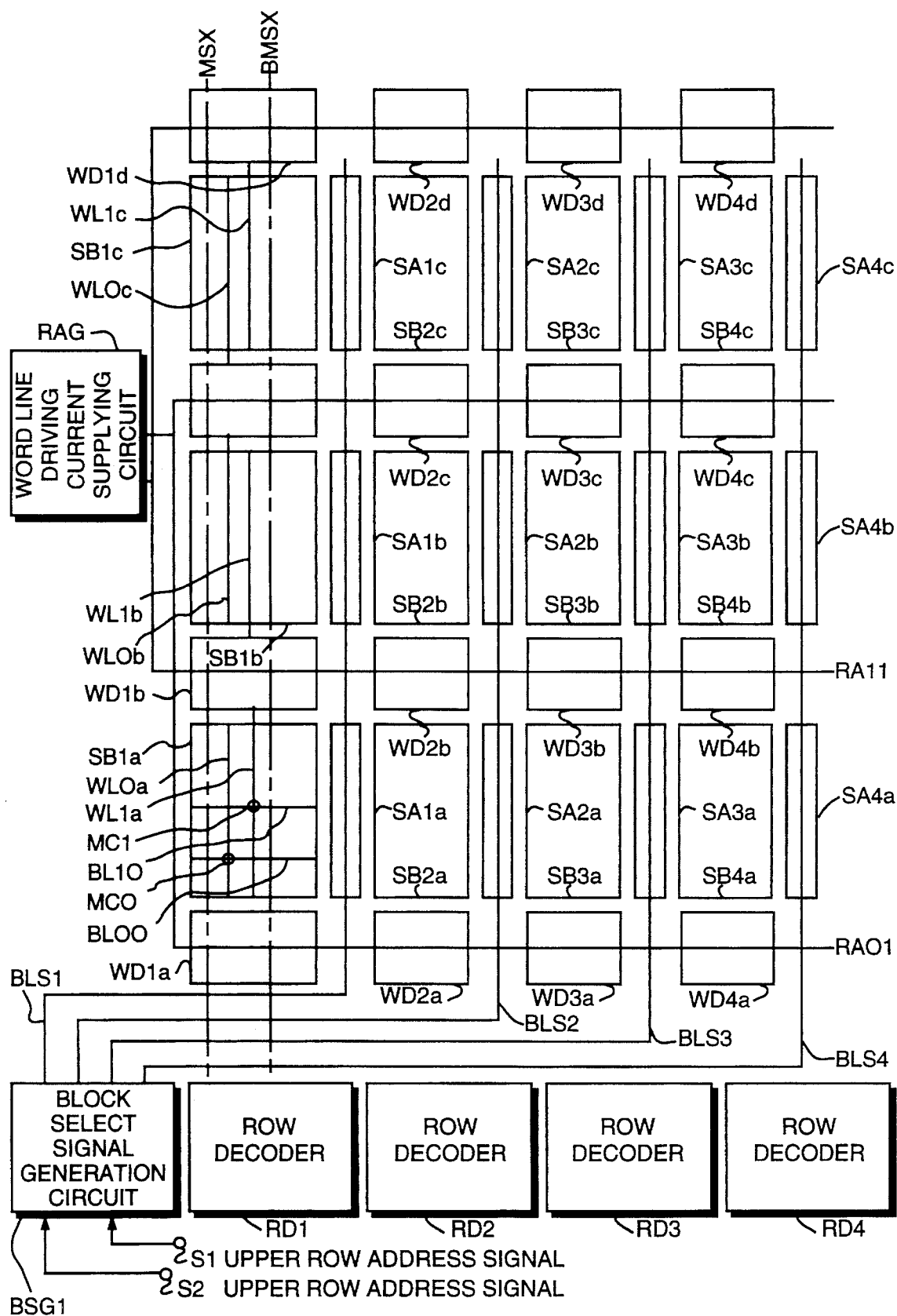
FIG. 1 is a circuit diagram showing the basic construction of a conventional example of a semiconductor memory device.
Figure 2:
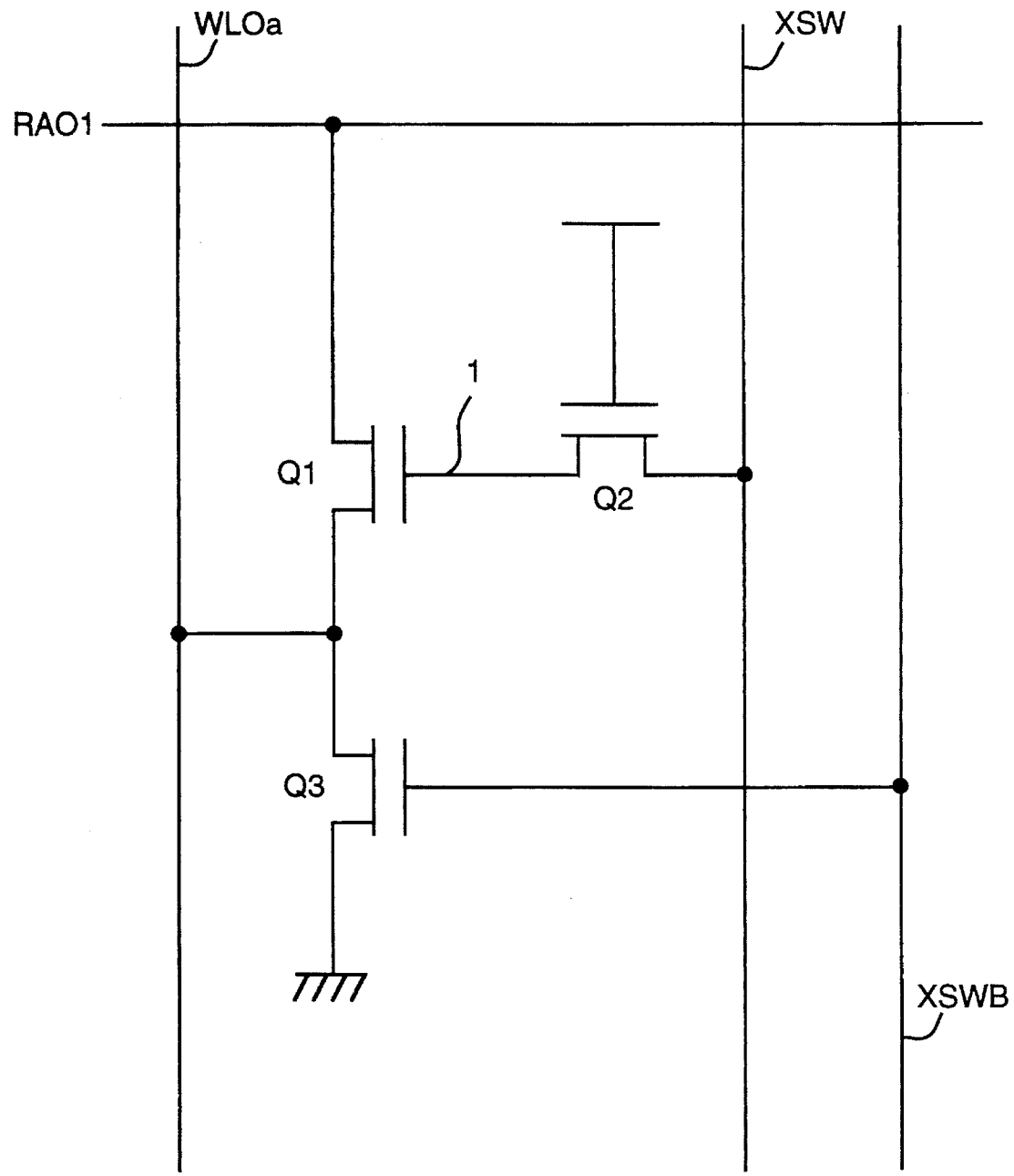
FIG. 2 is a circuit diagram of a word line driving circuit represented by WD1a in FIG. 1.
Figure 3:
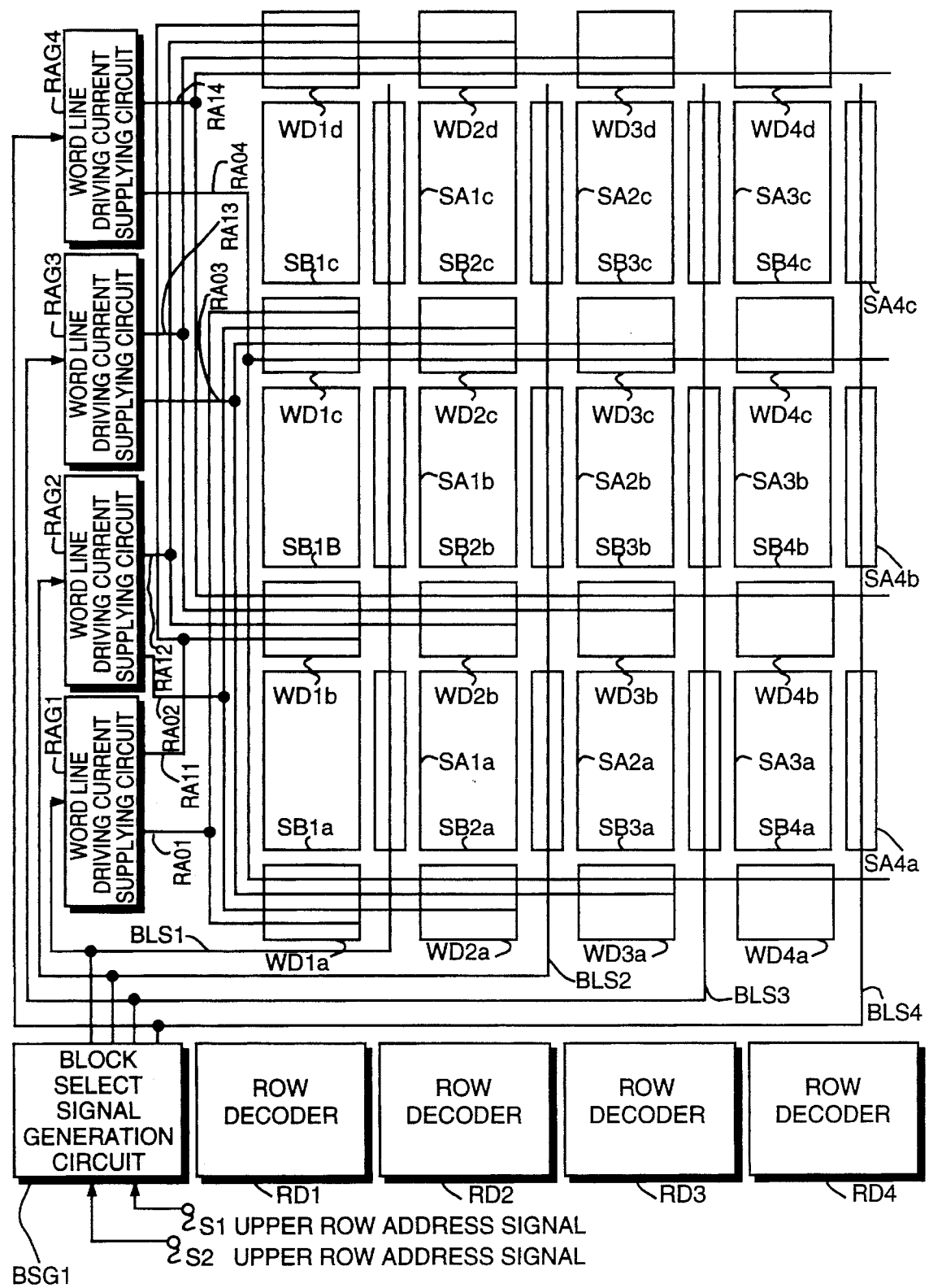
FIG. 3 is a circuit diagram showing the basic construction of a semiconductor memory device according to a first embodiment of the present invention.

FIG. 3 is a circuit diagram showing the basic construction of a first embodiment of the present invention.

In the present embodiment, word line driving current supplying circuits RAG1 to RAG4 are provided for sub blocks SB1a to SB1c, SB2a to SB2c, SB3a to SB3a and SB4a to SB4a, respectively. The word line driving current supplying circuits RAG1 to RAG4 are selected by two bits of an upper row address, and the same signals BLS1 to BLS4 inputted as block select signals to sensing amplifiers SA1a to SA1c, SA2a to SA2c, SA3a to SA3c and SA4a to SA4c are inputted to word line driving current supplying circuits RAG1 to RAG4, respectively. In particular, word line driving current supplying circuit RAG1 corresponds to sub blocks SB1a to SB1c; word line driving current supplying circuit RAG2 corresponds to sub blocks SB2a to SB2c; word line driving current supplying circuit RAG3 corresponds to sub blocks SB3a to SB3a; and word line driving current supplying circuit RAG4 corresponds to sub clocks SB4a to SB4a, and one of word line driving current supplying circuits RAG1 to RAG4 is selected and activated in response to activated sub blocks.

Word line driving current supplying circuit RAG1 supplies word line driving current supplying signal RA01 to word line driving circuits WD1a and WD1c, and supplies word line driving current supplying signal RA11 to word line driving circuits WD1b and WD1d. Word line driving current supplying circuit RAG2 supplies word line driving current supplying signal RA02 to word line driving circuits WD2a and WD2c and supplies word line driving current supplying signal RA12 to word line driving circuits WD2b and WD2d. Word line driving current supplying circuit RAG3 supplies word line driving current supplying signal RA03 to word line driving circuits WD3a and WD3c and supplies word line driving current supplying signal RA13 to word line driving circuits WD3b and WD3d. Word line driving current supplying circuit RAG4 supplies word line driving current supplying signal RA04 to word line driving circuits WD4a and WD4c and supplies word line driving current supplying signal RA14 to word line driving circuits WD4b and WD4d.

In the present embodiment, the number of word line driving circuits connected to word line driving current supplying signals is ¼ that of the conventional example, and as a result, the load capacitance of the word line driving current supplying signal is reduced, thereby enabling reduction of the word line rising time and reduction of the current consumption upon rising of the word line. For example, if it is assumed that 30% of the load capacitance upon rising of a word line is conventionally occupied by the load capacitance of a word line driving current supplying circuit, according to the present embodiment, this 30% portion of the load capacitance can be reduced by ¾, and consequently, the overall load capacitance can be reduced by about 23%. Since the current consumption increases in proportion to the load capacitance to be charged and discharged, the current consumption upon rising of a word line can be reduced by an equal 23%. Further, since the entire time constant is reduced by 23%, the word line rising time is reduced by a similar amount, although the actual amount of reduction remains somewhat dependent on such factors as how the load is dispersed by the wiring line layout.

For simplification of the drawings, the number of blocks to be selected by an upper row address has been limited to four in the present embodiment, the present invention can naturally be applied to cases wherein the number of blocks is five or more. Further, in the present embodiment, while the bit size of an upper row address for selection of a block is equal to the bit size of a row address to be inputted to a word line driving current supplying circuit, they naturally need not be equal to each other, and the numbers may be determined suitably based on a trade-off between an increase of the word line rising speed and an increase in the chip area caused by an increase of the number of word line driving current supplying circuits.

Figure 4:
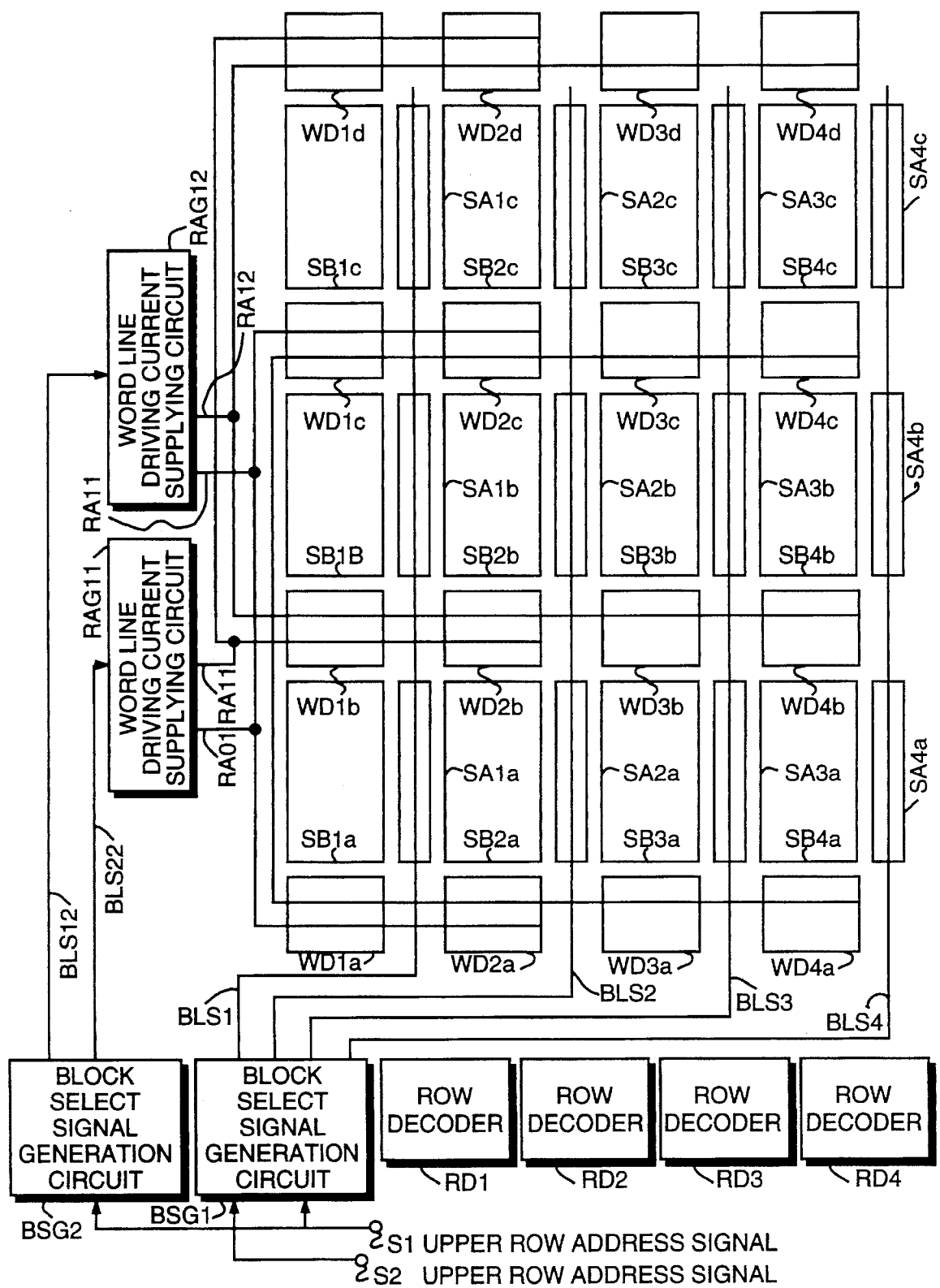
FIG. 4 is a circuit diagram showing the basic construction of a semiconductor r memory device according to a second embodiment of the present invention.

FIG. 4 is a circuit diagram showing the basic construction of a second embodiment of the present invention wherein the bit size of an upper row address for selection of a block (activation of a sensing amplifier) and the bit size of an upper row address to be inputted to a word line driving current supplying circuit are made different from each other.

The present embodiment includes word line driving current supplying circuit RAG11 for supplying word line driving current supplying signal RA01 to word line driving circuits WD1a, WD2a, WD1c, and WD2c and supplying word line driving current supplying signal RA11 to word line driving circuits WD1b, WD2b, WD1d and WD2a, and word line driving current supplying circuit RAG12 for supplying word line driving current signal RA02 to word line driving circuits WD3a, WD4a, WD3c and WD4c and supplying word line driving current supplying signal RA12 to word line driving circuits WD3b, WD4b, WD3d and WD4d.

In the present embodiment, the number of word line driving current supplying circuits is equal to one half the number in the first embodiment, and outputs BLS12 and BLS22 of block select signal generation circuit BSG2, which are inputted to the word line driving current supplying circuits RAG11 and RAG12 to select a word line driving current supplying circuit, are generated only by an upper row address signal S1.

Since the construction described above can reduce the area occupied by the word line driving current supplying circuits and the area occupied by the word line driving current supplying signals, this is an effective means where it is desired to limit an increase of the chip area.

Further, the following connection is effective between a word line driving current supplying signal and the word line driving circuits of each block. In particular, in a case wherein n blocks are provided and one bit of a row address is inputted as a selection signal to the word line driving current supplying circuits as described above, the connection should be such that, for example, when the inputted address of one bit is 0, the word line driving current supplying signal to be activated is connected to the 1st, 3rd, 5th, . . . and n-1th blocks, whereas the word line driving current supplying signal to be activated is connected to the 2nd, 4th, 6th, . . . and nth blocks when the address is 1.

In other words, the blocks are connected such that those blocks which are activated when the address is 0 and those block which are activated when the address is 1 are disposed alternately. In this instance, the load capacitance of each word line driving current supplying signal is divided and disposed substantially uniformly over the wiring line length, and accordingly, whichever one of the word line driving current supplying signals is selected, the word line rising time is substantially equal. Accordingly, setting of the timing of activation of the sensing amplifiers after rising of the word lines is easy.

What is claimed is:

1. A semiconductor memory device comprising:

a memory cell array including a plurality of memory cells disposed in rows and columns, said memory cell array being divided into a plurality of blocks selected by an upper row address, each block of said memory cell array being further divided into an equal number of sub blocks in a word line direction;

a plurality of word lines for selecting a row of said plurality of memory cell arrays;

a plurality of bit lines to which a column of said memory cell array is connected;

block select signal generation circuit means for inputting all or an upper part of the row address and outputting a block select signal indicative of a block corresponding to said all or upper part of the row address;

sensing amplifiers corresponding to each of said sub-blocks for amplifying data of the corresponding bit lines, said sensing amplifiers in each block being activated in response to the block select signal indicative of the block;

word line driving circuit means corresponding to each of said sub blocks;

row decoders for selecting the word line driving circuit means in each of said blocks; and a plurality of word line driving signal supplying circuit means, each word line driving signal supplying circuit means supplying word line driving signals to the word line driving circuit means corresponding to said sub blocks in a block or block group corresponding to the word line driving signal supplying circuit means in response to said all or upper part of the row address for selection of the corresponding block or the corresponding block group.

2. The semiconductor memory device as claimed in claim 1, wherein one bit of a row address is inputted as a selection signal to said word line driving signal supplying circuit means, and those of said blocks which are connected to a word line driving signal which is activated when said one bit is 1 and those of said blocks which are connected to another word line driving signal which is activated when said one bit is 0 are disposed alternately.

3. A semiconductor memory device comprising:

a memory cell array including a plurality of memory cells disposed in rows and columns, said memory cell array being divided into a plurality of blocks selected by an upper row address, each block of said memory cell array being further divided into an equal number of sub blocks in a word line direction;

a plurality of word lines for selecting a row of said plurality of memory cell arrays;

a plurality of bit lines to which a column of said memory cell array is connected;

block select signal generation circuit means for inputting all or an upper part of the row address and for outputting a block select signal indicative of the block corresponding to said all or upper part of the row address;

sensing amplifiers corresponding to each of said sub blocks for amplifying data of the corresponding bit lines, said sensing amplifiers in each block being activated in response to the block select signal indicative of the block;

word line driving circuit means corresponding to each of said sub blocks;

row decoders for selecting the word line driving circuit means in each of said blocks; and a plurality of word line driving signal supplying circuit means, each word line driving signal supplying circuit means supplying word line driving signals to the word line driving circuit means corresponding to said sub blocks in the block corresponding to the word line driving signal supplying circuit means in response to the block select signal indicative of said block.

4. A semiconductor memory device comprising:

a memory cell array including a plurality of memory cells disposed in rows and columns, said memory cell array being divided into a plurality of blocks selected by an upper row address, each block of said memory cell array being further divided into an equal number of sub blocks in a word line direction;

a plurality of word lines for selecting a row of said plurality of memory cell arrays;

a plurality of bit lines to which a column of said memory cell array is connected first block select signal generation circuit means for inputting all or an upper part of the row address and for outputting a first block select signal indicative of the block corresponding to said all or upper part of the row address;

sensing amplifiers corresponding to each of said sub blocks for amplifying data of the corresponding bit lines, said sensing amplifiers in each block being activated in response to the first block select signal indicative of said block, word line driving circuit means corresponding to each of said sub blocks;

row decoders for selecting the word line driving circuit means in each of said blocks;

second block select signal generation circuit means for outputting a second block select signal indicative of the block group corresponding to said all or part of the row address; and a plurality of word line driving signal supplying circuit means, each word line driving signal supplying circuit means supplying word line driving signals to the word line driving circuit means corresponding to said sub blocks in the block group corresponding to the word line driving signal supplying circuit means in response to the second block select signal indicative of said block group.

* * * * *

UNITED STATES PATENT AND TRADEMARK OFFICE
CERTIFICATE OF CORRECTION

PATENT NO. : 5,517,456
DATED : May 14, 1996
INVENTOR(S) : Shigeo CHISHIKI

It is certified that error appears in the above-indentified patent and that said Letters Patent is hereby corrected as shown below:

Col. 8, Claim 4, line 19, after "for" insert --inputting said all or upper part of the row address and for--.

Signed and Sealed this

Seventeenth Day of September, 1996

Attest:

BRUCE LEHMAN

*Attesting Officer*  *Commissioner of Patents and Trademarks*

UNITED STATES PATENT AND TRADEMARK OFFICE
CERTIFICATE OF CORRECTION

| | | |
|---|---|---|
| PATENT NO. | : 5,517,456 | |
| APPLICATION NO. | : 08/330796 | |
| DATED | : May 14, 1996 | |
| INVENTOR(S) | : Chishiki et al. | |

It is certified that error appears in the above-identified patent and that said Letters Patent is hereby corrected as shown below:

Column 6, line 18, cancel the text beginning with "1. A semiconductor memory" to and ending with "the corresponding block group." in column 6, line 52 and insert the following amended claim:

--1. A semiconductor memory device comprising:
a memory cell array including a plurality of memory cells disposed in rows and columns, said memory cell array being divided into a plurality of blocks selected by an upper row address, each block of said memory cell array being further divided into an equal number of sub blocks in a word line direction;
a plurality of word lines for selecting a row of said plurality of memory cells;
a plurality of bit lines to which a column of said memory cell array is connected;
block select signal generation circuit means for inputting all or an upper part of the row address and outputting a block select signal indicative of a block corresponding to said all or upper part of the row address;
sensing amplifiers corresponding to each of said sub-blocks for amplifying data of the corresponding bit lines, said sensing amplifiers in each block being activated in response to the block select signal indicative of the block;
word line driving circuit means corresponding to each of said sub blocks;
row decoders for selecting the word line driving circuit means in each of said blocks; and
a plurality of word line driving signal supplying circuit means, each word line driving signal supplying circuit means supplying word line driving signals to the word line driving circuit means corresponding to all of said sub blocks in a block corresponding to the word line driving signal supplying circuit means in response to said all or upper part of the row address for selection of the corresponding block.--

Column 6, line 61, cancel the text beginning with "3. A semiconductor memory" to and ending with "of said block." in column 7, line 25 and insert the following amended claim:

--3. A semiconductor memory device comprising:
a memory cell array including a plurality of memory cells disposed in rows and columns, said Signed and Sealed this
Twenty-seventh Day of September, 2011

David J. Kappos
*Director of the United States Patent and Trademark Office* memory cell array being divided into a plurality of blocks selected by an upper row address, each block of said memory cell array being further divided into an equal number of sub blocks in a word line direction;

a plurality of word lines for selecting a row of said plurality of memory cells;

a plurality of bit lines to which a column of said memory cell array is connected;

block select signal generation circuit means for inputting all or an upper part of the row address and for outputting a block select signal indicative of the block corresponding to said all or upper part of the row address;

sensing amplifiers corresponding to each of said sub blocks for amplifying data of the corresponding bit lines, said sensing amplifiers in each block being activated in response to the block select signal indicative of the block;

word line driving circuit means corresponding to each of said sub blocks;

row decoders for selecting the word line driving circuit means in each of said blocks; and a plurality of word line driving signal supplying circuit means, each word line driving signal supplying circuit means supplying word line driving signals to the word line driving circuit means corresponding to all of said sub blocks in the block corresponding to the word line driving signal supplying circuit means in response to the block select signal indicative of said block.

Column 7, line 26, cancel the text beginning with "4. A semiconductor memory" to and ending with "of said block group." in column 8, line 30 and insert the following amended claim:

--4. A semiconductor memory device comprising:

a memory cell array including a plurality of memory cells disposed in rows and columns, said memory cell array being divided into a plurality of blocks selected by an upper row address, each block of said memory cell array being further divided into an equal number of sub blocks in a word line direction;

a plurality of word lines for selecting a row of said plurality of memory cells;

a plurality of bit lines to which a column of said memory cell array is connected;

first block select signal generation circuit means for inputting all or an upper part of the row address and for outputting a first block select signal indicative of the block corresponding to said all or upper part of the row address;

sensing amplifiers corresponding to each of said sub blocks for amplifying data of the corresponding bit lines, said sensing amplifiers in each block being activated in response to the first block select signal indicative of said block, word line driving circuit means corresponding to each of said sub blocks;

row decoders for selecting the word line driving circuit means in each of said blocks;

second block select signal generation circuit means for inputting said all or upper part of the row address and for outputting a second block select signal indicative of the block group corresponding to said all or part of the row address; and a plurality of word line driving signal supplying circuit means, each word line driving signal supplying circuit means supplying word line driving signals to the word line driving circuit means corresponding to all of said sub blocks in the block group corresponding to the word line driving signal supplying circuit means in response to the second block select signal indicative of said block group.--

(12) EX PARTE REEXAMINATION CERTIFICATE (7048th)
United States Patent
Chishiki

(10) Number: US 5,517,456 C1
(45) Certificate Issued: Sep. 8, 2009

(54) SEMICONDUCTOR MEMORY DEVICE INCLUDING A WORD LINE DRIVING CIRCUIT OF THE DIVISIONAL DECODING TYPE

(75) Inventor: Shigeo Chishiki, Tokyo (JP)

(73) Assignee: NEC Electronics Corporation, Nakahara-ku, Kawasaki, Kanagawa (JP)

Reexamination Request:
No. 90/008,940, Nov. 29, 2007

Reexamination Certificate for:
Patent No.: 5,517,456
Issued: May 14, 1996
Appl. No.: 08/330,796
Filed: Oct. 28, 1994

Certificate of Correction issued Sep. 17, 1996.

(51) Int. Cl.
*G11C 8/08* (2006.01)
*G11C 8/12* (2006.01)
*G11C 8/00* (2006.01)

(52) U.S. Cl. .................. 365/230.03; 365/230.04; 365/230.06

(58) Field of Classification Search .............. 365/230.04
See application file for complete search history.

(56) References Cited

U.S. PATENT DOCUMENTS

| | | | |
|---|---|---|---|
| 5,097,450 A | 3/1992 | Toda et al. |
| 5,222,047 A | 6/1993 | Matsuda et al. |
| 5,282,175 A | 1/1994 | Fujita et al. |
| 5,351,217 A | 9/1994 | Jeon et al. |
| 5,406,526 A | 4/1995 | Sugibayashi et al. |

FOREIGN PATENT DOCUMENTS

| | | | |
|---|---|---|---|
| JP | 02-076194 | | 3/1990 |
| JP | 04-243089 | | 8/1992 |
| JP | 04-318392 | | 11/1992 |
| JP | 05-226613 | * | 9/1993 |

* cited by examiner

*Primary Examiner*—Fred Ferris

(57) ABSTRACT

A memory cell array is divided into a plurality of blocks selected by an upper row address and further divided into a plurality of sub blocks in a word line direction. Word line driving circuits are provided individually for each of the sub blocks. Further, a plurality of word line driving current supplying circuits are provided which are selectively activated in response to an input of all or part of an upper row address for selection of one of the plurality of blocks to supply word line driving current to the word line driving circuits. The word line driving circuits in the same column direction are supplied with word line driving current by way of at least two signal lines.

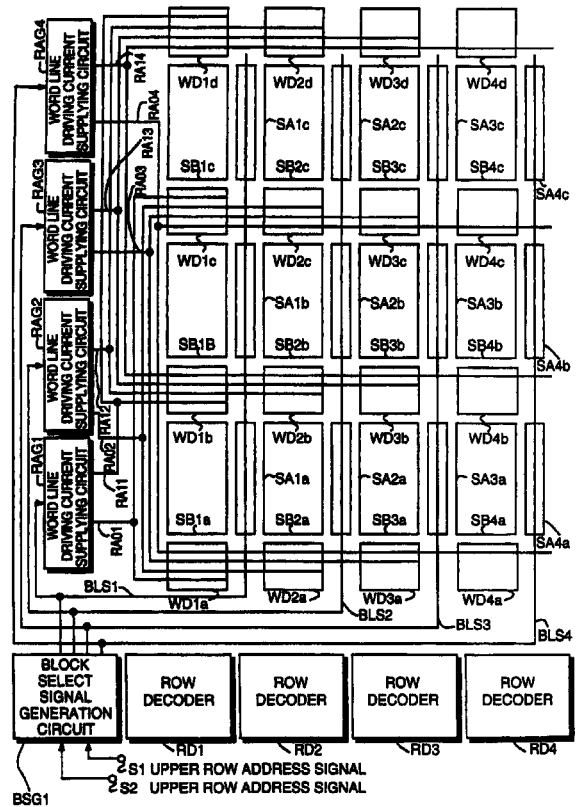

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3 and 4 are determined to be patentable as amended.

Claim 2 was not reexamined.

1. A semiconductor memory device comprising:
   a memory cell array including a plurality of memory cells disposed in rows and columns, said memory cell array being divided into a plurality of blocks selected by an upper row address, each block of said memory cell array being further divided into an equal number of sub blocks in a word line direction;
   a plurality of word lines for selecting a row of said plurality of memory cell arrays;
   a plurality of bit lines to which a column of said memory cell array is connected;
   block select signal generation circuit means for inputting all or an upper part of the row address and outputting a block select signal indicative of a block corresponding to said all or upper part of the row address;
   sensing amplifiers corresponding to each of said sub-blocks for amplifying data of the corresponding bit lines, said sensing amplifiers in each block being activated in response to the block select signal indicative of the block;
   word line driving circuit means corresponding to each of said sub blocks;
   row decoders for selecting the word line driving circuit means in each of said blocks; and
   a plurality of word line driving signal supplying circuit means, each word line driving signal supplying circuit means supplying word line driving signals to the word line driving circuit means corresponding to *all of* said sub blocks in a block [or block group] corresponding to the word line driving signal supplying circuit means in response to said all or upper part of the row address for selection of the corresponding block [or the corresponding block group].

3. A semiconductor memory device comprising:
   a memory cell array including a plurality of memory cells disposed in rows and columns, said memory cell array being divided into a plurality of blocks selected by an upper row address, each block of said memory cell array being further divided into an equal number of sub blocks in a word line direction;
   a plurality of word lines for selecting a row of said plurality of memory cell arrays;
   a plurality of bit lines to which a column of said memory cell array is connected;
   block select signal generation circuit means for inputting all or an upper part of the row address and outputting a block select signal indicative of a block corresponding to said all or upper part of the row address;
   sensing amplifiers corresponding to each of said sub blocks for amplifying data of the corresponding bit lines, said sensing amplifiers in each block being activated in response to the block select signal indicative of the block;
   word line driving circuit means corresponding to each of said sub blocks;
   row decoders for selecting the word line driving circuit means in each of said blocks; and
   a plurality of word line driving signal supplying circuit means, each word line driving signal supplying circuit means supplying word line driving signals to the word line driving circuit means corresponding to *all of* said sub blocks in a block corresponding to the word line driving signal supplying circuit means in response to the block select signal indicative of said block.

4. A semiconductor memory device comprising:
   a memory cell array including a plurality of memory cells disposed in rows and columns, said memory cell array being divided into a plurality of blocks selected by an upper row address, each block of said memory cell array being further divided into an equal number of sub blocks in a word line direction;
   a plurality of word lines for selecting a row of said plurality of memory cell arrays;
   a plurality of bit lines to which a column of said memory cell array is connected
   *first* block select signal generation circuit means for inputting all or an upper part of the row address and for outputting a *first* block select signal indicative of the block corresponding to said all or upper part of the row address;
   sensing amplifiers corresponding to each of said sub blocks for amplifying data of the corresponding bit lines, said sensing amplifiers in each block being activated in response to the *first* block select signal indicative of said block,
   word line driving circuit means corresponding to each of said sub blocks;
   row decoders for selecting the word line driving circuit means in each of said blocks;
   *second block select signal generation circuit means for inputting said all or upper part of the row address and for outputting a second block select signal indicative of the block group corresponding to said all or part of the row address;* and
   a plurality of word line driving signal supplying circuit means, each word line driving signal supplying circuit means supplying word line driving signals to the word line driving circuit means corresponding to *all of* said sub blocks in a block group corresponding to the word line driving signal supplying circuit means in response to the *second* block select signal indicative of said block group.

* * * * *